(12) United States Patent
Kannengießer et al.

(10) Patent No.: US 7,319,324 B2
(45) Date of Patent: Jan. 15, 2008

(54) MRI METHOD AND APPARATUS USING PPA IMAGE RECONSTRUCTION

(75) Inventors: Stephan Kannengießer, Erlangen (DE); Berthold Kiefer, Erlangen (DE); Mathias Nittka, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 357 days.

(21) Appl. No.: 10/988,127

(22) Filed: Nov. 12, 2004

(65) Prior Publication Data

US 2005/0187458 A1    Aug. 25, 2005

(30) Foreign Application Priority Data

Nov. 14, 2003   (DE) .................... 103 53 342

(51) Int. Cl.
*G01V 3/00* (2006.01)
(52) U.S. Cl. ..................................... 324/309
(58) Field of Classification Search ........ 324/300–322; 600/410–435
See application file for complete search history.

(56) References Cited

U.S. PATENT DOCUMENTS

| | | | |
|---|---|---|---|
| 5,881,728 A | 3/1999 | Mistretta et al. | |
| 6,380,741 B1 * | 4/2002 | Hajnal et al. | 324/318 |
| 6,710,686 B2 * | 3/2004 | Mertelmeier et al. | 324/314 |
| 6,801,035 B2 | 10/2004 | Wang | |
| 6,841,998 B1 | 1/2005 | Griswold | |
| 7,002,344 B2 * | 2/2006 | Griswold et al. | 324/309 |
| 2002/0024339 A1 | 2/2002 | Van Den Brink | |
| 2003/0030437 A1 | 2/2003 | Bydder et al. | |
| 2003/0076099 A1 | 4/2003 | Hajnal et al. | |
| 2006/0284812 A1 * | 12/2006 | Griswold et al. | 345/92 |

OTHER PUBLICATIONS

"Advances In Sensitivity Encoding With Arbitrary κ-Space Trajectories," Pruessmann et al, Magnetic Resonances In Medicine, vol. 46 (2001) pp. 638-651.

* cited by examiner

Primary Examiner—Brij Shrivastav
Assistant Examiner—Dixomara Vargas
(74) Attorney, Agent, or Firm—Schiff Hardin LLP

(57) ABSTRACT

In a method and apparatus for magnetic resonance imaging based on a partially parallel acquisition (PPA) reconstruction technique, a number of partial k-space data sets are acquired with a number of component coils, the totality of the partial data sets forming a complete k-space data set, the respective coil sensitivity of each component coil is determined based on at least one part of the complete k-space data set, any partial k-space data set is transformed via a PPA reconstruction technique dependent on the determined coil sensitivities, and the transformed partial data sets are superimposed to obtain a low-artifact image data set.

12 Claims, 4 Drawing Sheets

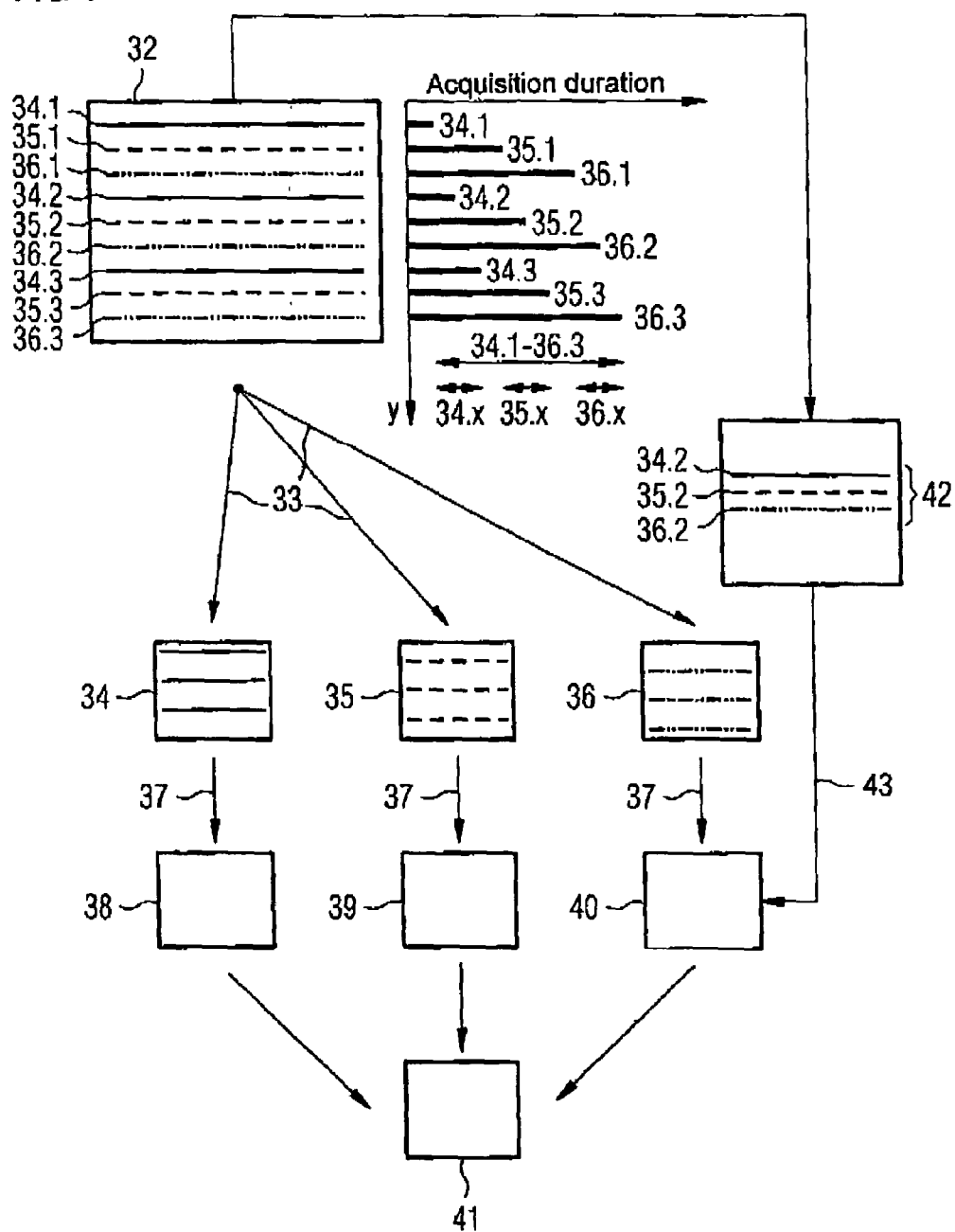

MRI METHOD AND APPARATUS USING PPA IMAGE RECONSTRUCTION

BACKGROUND OF THE INVENTION

1. Field of the Invention

The present invention generally concerns magnetic resonance tomography (MRT) as used in medicine for the examination of patients. The present invention concerns a method as well as an MRT system for the implementation of the method that enable the acquisition of artifact-free or low-artifact slice images without SNR (signal-to-noise ratio) loss.

2. Description of the Prior Art

MRT is based on the physical phenomenon of nuclear magnetic resonance and has been successfully used as an imaging method for over 15 years in medicine and biophysics. In this examination modality, the subject is exposed to a strong, constant magnetic field. The nuclear spins of the atoms in the subject, which were previously randomly oriented, thereby align.

Radio-frequency energy can now excite these "ordered" nuclear spins to a specific oscillation (resonance frequency). In MRT, this oscillation generates the actual measurement signal (RF response signal) which is acquired by means of appropriate reception coils. By the use of inhomogeneous magnetic fields generated by gradient coils, the measurement subject can be spatially coded in all three spatial directions. The slice to be imaged can be freely selected, and slice images of the human body can be acquired in all directions. MRT as a slice imaging modality in medical diagnostics is primarily considered as a "non-invasive" examination modality with a manifold contrast capability. Due to the excellent representation capability of soft tissue, the MRT has developed into a modality that is superior to x-ray computed tomography (CT). MRT today is based on the application of spin echo and gradient echo sequences that enable an excellent image quality with measurement times in the range of minutes.

The constant technical development of the components of MRT apparatuses and the introduction of faster imaging sequences continually open more fields of use in medicine for MRT. Real-time imaging for the support of minimally invasive surgery, functional imaging in neurology and perfusion measurement in cardiology are only a few examples. In spite of the technical advances in the construction of MRT apparatuses, acquisition times and the signal-to-noise ratio (SNR) of an MRT image remain limiting factors for many applications of MRT in medical diagnostics.

Particularly in functional imaging, in which a significant movement of the subject or parts of the subject is present (blood flow, heart movement, peristalsis of the abdomen, etc.), a reduction of the data acquisition time with a constant SNR is desirable. Movement generally causes artifacts (such as, for example, movement artifacts) in an MRT image that increase with the duration of the data acquisition time. In order to improve the image quality, it might be considered to acquire a number of images and to later superimpose them, but this does not always lead to an improvement of the overall image quality, particularly with regard to movement artifacts. For example, the SNR is improved while the movement artifacts increase.

With consistent SNR, one approach to shorten the measurement time is to reduce the quantity of the image data to be acquired. In order to obtain a complete image from such a reduced data set, either the missing data must be reconstructed with suitable algorithms or the missing image portion must be corrected from the reduced data. The acquisition of the data in MRT occurs (according to FIG. 2) in a mathematical space known as k-space (frequency domain). The MRT image in the image domain is linked with the MRT data 23 in k-space by means of Fourier transformation 24. The spatial coding of the subject which spans k-space occurs by means of gradients in all three spatial directions. In the case of 2D imaging, a distinction is made between the slice selection direction (establishes an acquisition slice in the subject, typically the z-axis) and the phase coding direction (determines the second dimensional within the slice, typically the y-axis). In the case of 3D imaging, the slice selection direction is replaced by a second phase coding direction. Without limitation of the generality, in the discussion that follows a two-dimensional Cartesian k-space is assumed that is sampled line-by-line. The data of a single k-space line are frequency-coded upon readout by means of a gradient. Each line in k-space has a separation $\Delta k_y$ that is generated by a phase coding step. Since the phase coding occupies a lot of time in comparison to the other spatial codings, to reduce the image measurement time most techniques (for example "partial parallel acquisition" PPA) are based on a reduction of the number of time-consuming phase coding steps. The fundamental idea in PPA imaging is that the k-space data are not acquired by a single coil but rather (according to FIG. 3) by a (for example) linear arrangement of component coils (coil 1 through coil 4), a coil array. Each of the spatially independent coils of the array carries certain spatial information, which is used in order to achieve a complete spatial coding by a combination of the simultaneously acquired coil data 26.1, 26.2, 26.3, 26.4. This means that a number of other shifted (shown white in the following figures) lines not scanned in k-space can be determined from a single acquired k-space line (shown grey in the following figures).

The PPA methods thus use spatial information contained in the components of a coil arrangement in order to partially replace the time-consuming phase coding that is normally generated using a phase gradient. The image measurement time is thereby reduced corresponding to the ratio of the number of the lines of the reduced data set to the number of the lines of the conventional (thus complete) data set. In a typical acquisition of data by PPA, in comparison to the conventional acquisition only a fraction (½, ⅓, ¼, etc.) of the phase coding lines is acquired. A special reconstruction is then applied to the data in order to reconstruct the lacking k-space lines and therewith to obtain the whole field of view (FOV)-image in a fraction of the time.

The image reconstruction method that is used, which normally is an algebraic method, corresponds to the respective PPA technique that is used. The most widely known PPA techniques are SMASH (Simultaneously Acquisition of Spatial Harmonics), SENSE (Sensitivity Encoding) and GRAPPA (Generalized Autocalibration PPA) with their respective derivates (G-SMASH, AUTO-SMASH, VD-AUTO-SMASH etc.).

In all PPA techniques the algebraic reconstruction of the missing k-space lines additionally requires the determination of the coil sensitivity of each component coil (participating in the measurement), which is symbolized by the arrow 28 in FIG. 3. A complete reconstruction of all k-space lines is possible only given such knowledge of the coil sensitivities, and the image 25 is obtained by subsequent Fourier transformation (arrow 27).

In the conventional PPA techniques, the determination of the coil sensitivities ensues by calibration scans, either at the beginning of the diagnostic data acquisition in the form of pre-scans, or during the diagnostic data acquisition the form of integrated scans 29 (ACS lines, autocalibration signals), which are shown in FIG. 4 as black k-space lines in the middle region of the k-matrix (k-space slice).

The coil sensitivities are in fact harmonic functions that can be well-approximated via only a few calibration scan lines, preferably from the middle region of the k-matrix, which predominantly contains contrast information. Nevertheless, the measurement of calibration scan lines significantly lengthens the total acquisition time and increases the degree of movement artifacts in the reconstructed image 25.

The prior art offers a possibility to suppress or, respectively, to minimize movement artifacts with consistent SNR in spite of time-consuming measurements of calibration scan lines.

In one method for this purpose is explained using FIG. 5: a number of low-resolution PPA series 26 are acquired in temporal series. In FIG. 5 two series 26 are shown, wherein the calibration scan lines 29 necessary for PPA reconstruction have been concomitantly measured and are shown black. Due to the low resolution, each series inherently exhibits a relatively low SNR, however due to the short acquisition time movement artifacts of each series are also significantly reduced. Images with far fewer artifacts thus can be generated by subsequent superimposition of the images from both series of PPA-reconstructed images, with the original SNR being regained by the superimposition.

A disadvantage in this method is the fact that, as before, the data in the calibration scan lines must be additionally acquired for each slice, or for each series, in order to be able to determine the coil sensitivities necessary for the PPA reconstruction. This is true both for pre-scans and for integrated scans.

SUMMARY OF THE INVENTION

It is an object of the present invention to provide a method as well as a system to implement the method with which MRT imaging based on PPA reconstruction methods is improved with regard to the movement artifacts as well as with regard to the acquisition time.

This object is achieved according to the invention by a method for MRT imaging based on a PPA reconstruction method wherein a number of partial data sets of k-space are acquired with a number of component coils, the entirety of the partial data sets forming a complete k-space data set, the coil sensitivity of each component coil is determined based on a part of or based on the entire k-space data set, any partial data set in k-space is transformed by a reconstruction method based on determined coil sensitivities, and the transformed partial data sets, and superimposed to obtain a low-artifact image data set.

The complete k-space data set can be two-dimensional or three-dimensional.

The partial data sets are advantageously acquired in temporal sequence.

The acquisition the partial data sets inventively ensues such that each transformed partial data set contains a minimum of movement artifacts and/or distortions and/or signal loss.

The middle region of the k-space data set is advantageously used to determine the coil sensitivity.

Possible PPA reconstruction methods used for the inventive method are based on the SMASH reconstruction method, the AUTO-SMASH reconstruction method, the VD-AUTO-SMASH reconstruction method, the SENSE reconstruction method or the GRAPPA reconstruction method.

The acquisition of the partial data sets, and therewith the generation of the complete k-space data set, inventively generally ensues by sampling sub-units of k-space.

The sampling of sub-units of k-space inventively ensues such that given n partial data sets, the i-th partial data set (i=1 through n) ensues via first-time measurement of the i-th sub-unit as well as via subsequent respective omission of n−1 sub-units.

A sub-unit is thereby represented either by one line, one spiral arm or a radial section.

The acquisition and the transformation of the partial data sets, as well as the superimposition of the transformed partial data sets can be done in different manners, with the lowest-artifact end result being selected.

The above object also is achieved by a system to implement the inventive method.

DESCRIPTION OF THE DRAWINGS

FIG. 7 shows the inventive method in more detail.

DESCRIPTION OF THE PREFERRED EMBODIMENTS

Figure 1:
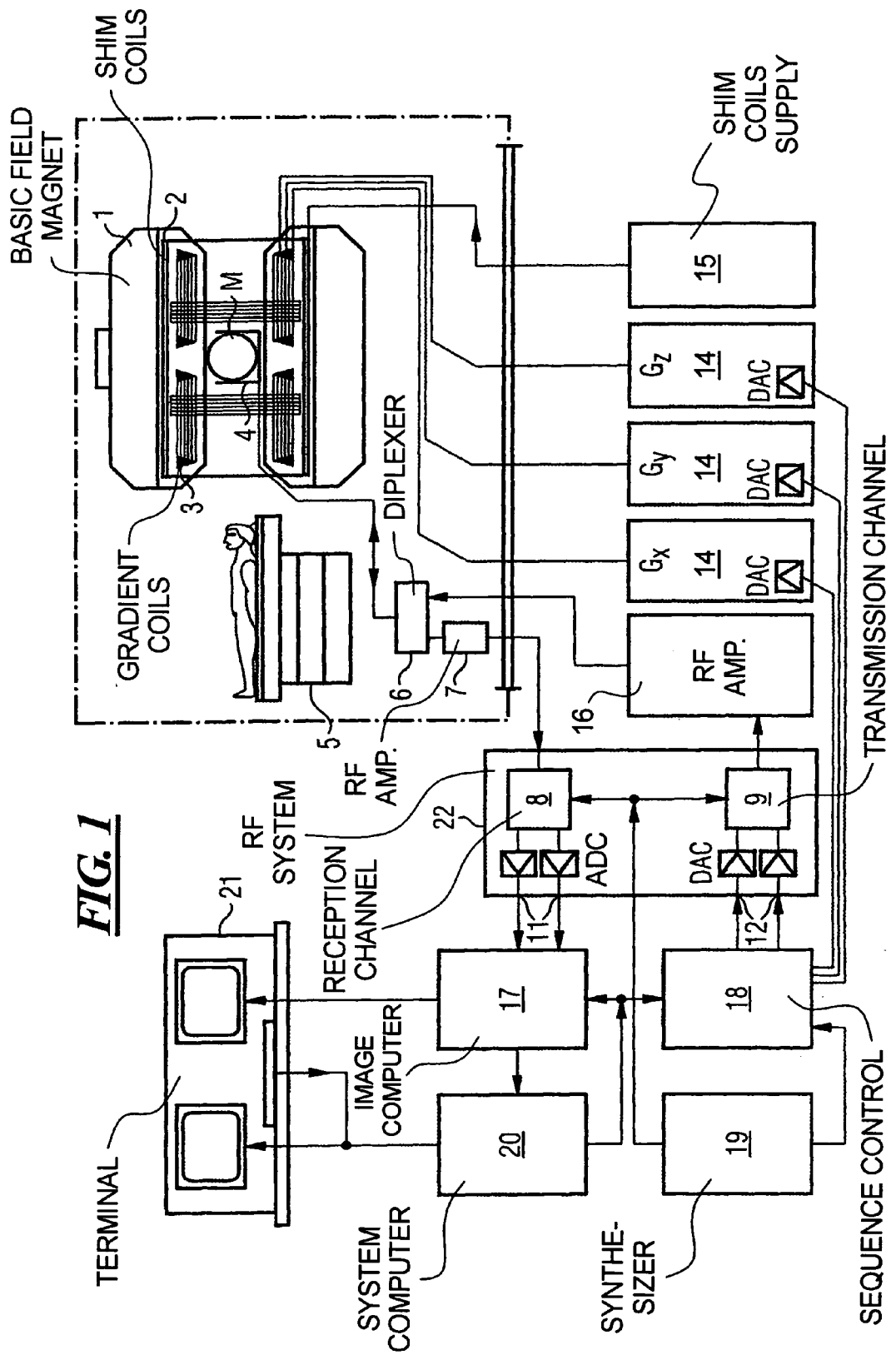
FIG. 1 is a schematic block diagram of an MRT apparatus to implement the inventive method.
Figure 2:
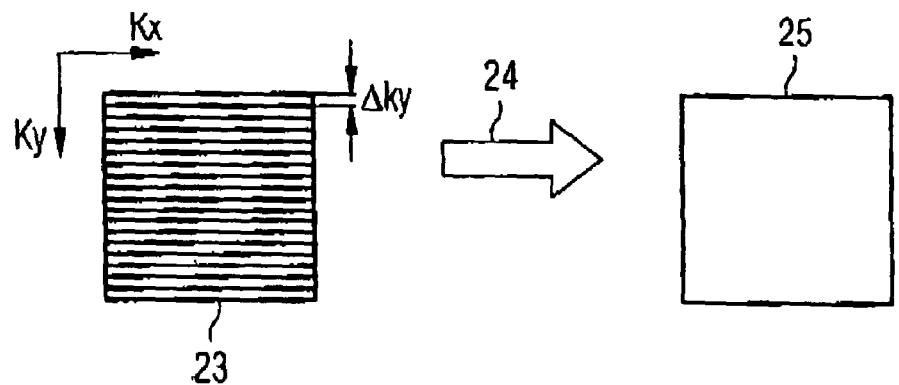
FIG. 2 schematically illustrates the conventional procedure for obtaining an MR image by Fourier transformation of an image in k-space.
Figure 3:
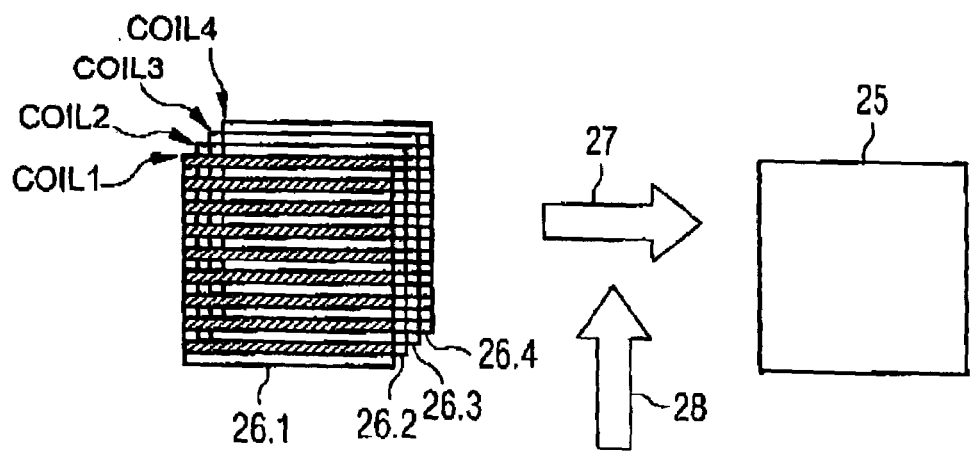
FIG. 3 schematically shows how a four-component PPA data set is reconstructed dependent on the coil sensitivities and is converted into an MR image by Fourier transformation.
Figure 4:
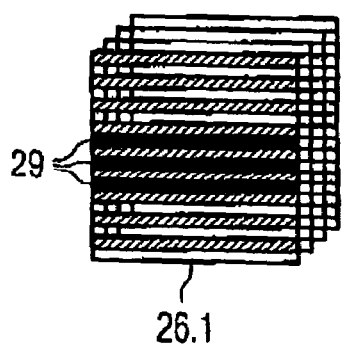
FIG. 4 schematically shows a four-component data set with three additionally acquired calibration scan lines that are required for the PPA reconstruction.
Figure 5:
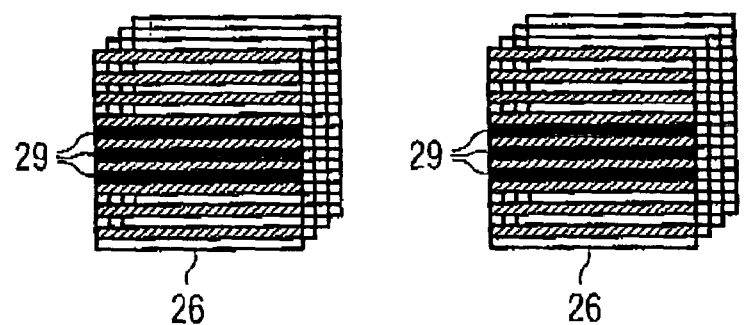
FIG. 5 schematic shows a method for PPA-based movement artifact-reduced image acquisition without SNR loss according to the prior art.

FIG. 1 schematically illustrates a magnetic resonance imaging or (tomography) apparatus to generate a nuclear spin image of a subject according to the present invention. The basic components of the magnetic resonance tomography apparatus correspond to the design of a conventional tomography apparatus, with the exceptions and differences described below. A basic field magnet 1 generates a temporally constant strong magnetic field for the polarization or alignment of the nuclear spins in the examination region of a subject such as, for example, a part of a human body. The high homogeneity of the basic magnetic field required for the magnetic resonance data acquisition is defined in a spherical volume M into which the part of the human body to be examined is introduced. Shim plates made of ferromagnetic material are mounted at suitable locations to support the homogeneity requirements and in particular to eliminate temporally in variable influences. Temporal variable influences are eliminated by shim coils 2 that are activated by a shim power supply 15.

A cylindrical gradient coil system 3 that is comprised of a number of windings is disposed in the basic field magnet 1. Each winding is supplied by an amplifier 14 with current to generate a linear gradient field in the respective direction of the Cartesian coordinate system. The first winding of the gradient coil system 3 generates a gradient $G_x$ in the x-direction; the second winding generates a gradient $G_y$ in the y-direction; and the third winding generates a gradient $G_z$ in the z-direction. Each amplifier 14 includes a digital-analog converter that is activated by a sequence controller 18 for the timed generation of gradient pulses.

In order to be able to alternately achieve both an improved signal-to-noise ratio (SNR) and a significant reduction of the acquisition time in the framework of PPA measurements, it is standard not to use a singe coil in the phase coding direction (y-direction), but rather to use an arrangement composed of a number of coils. These are known as component coils and are connected to form a coil array and are arranged overlapping one another, so overlapping coil images can be acquired. If, given improvement of the SNR, the acquisition time should not be lengthened, the coils of a coil array must simultaneously acquire data (signals). Each coil consequently requires its own receiver, including (as already mentioned) a pre-amplifier, a mixer and an analog-digital converter. This hardware is very expensive, which in practice leads to a limitation of the coil count in an array. At present arrays with a maximum of six individual coils are generally employed.

A radio-frequency antenna 4 that converts radio-frequency energy pulses emitted by a radio-frequency power amplifier 16 into a magnetic alternating field to excite the nuclei and align the nuclear spins of the subject to be examined, or the region of the subject to be examined, is located within the gradient field system 3. The radio-frequency antenna 4 is comprised of one or more RF transmission coils and a number of RF receiver coils in the form of the already-specified, preferably linear arrangement of component coils. The alternating field originating from the precessing nuclear spins, meaning normally the nuclear spin echo signals caused by a pulse sequence made up of one or more radio-frequency pulses and one or more gradient pulses, is converted by the RF receiver coils of the radio-frequency antenna 4 into a voltage that is supplied to a radio-frequency reception channel 8 of a radio-frequency system 22 via an amplifier 7. The radio-frequency system 22 furthermore has a transmission channel 9 in which the radio-frequency pulses are generated for the excitation of the nuclear magnetic resonance. The respective radio-frequency pulses are digitally represented as a series of complex numbers based on a pulse sequence in the sequence controller 18 predetermined by the system computer 20. This number series is supplied to inputs 12 of a digital-analog converter in the radio-frequency system 22, and from this to the transmission channel 9, as a real part and an imaginary part. In the transmission channel 9, the pulse sequences are modulated onto a radio-frequency carrier signal, the base frequency of which corresponds to the resonance frequency of the nuclear spins in the measurement volume.

Switching from transmission mode to reception mode ensues via a transmission-reception diplexer 6. The RF transmission coil of the radio-frequency antenna 4 radiates the radio-frequency pulses to excite the nuclear spins in the measurement volume M and samples resulting echo signals via the RF reception coils. The thus acquired magnetic resonance signals are phase-sensitively demodulated in the reception channel 8 of the radio-frequency system 22 and are converted into a real part and an imaginary part of the measurement signal via analog-digital converters. An image is reconstructed by an image computer 17 from the measurement data acquired in such a manner. The administration of the measurement data, the image data and the control programs ensues via the system computer 20. According to a selected control program, the sequence controller oversees the generation of the desired pulse sequences and the corresponding sampling of k-space. The sequence controller 18 in particular controls the timed switching of the gradients, the emission of the radio-frequency pulses with defined phase and amplitude, as well as the reception of the magnetic resonance signals. The time base for the radio-frequency system 22 and the sequence controller 18 is provided by a synthesizer 19. The selection of corresponding control programs to generate a magnetic resonance image as well as the representation of the generated magnetic resonance image ensue via a terminal 21, which has a keyboard as well as one or more screens.

Figure 6:
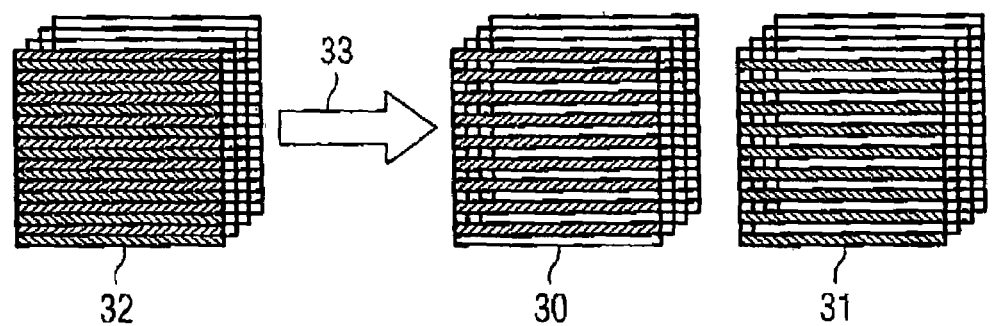
FIG. 6 is an overview of the inventive method.

In accordance with the present invention, using a number of component coils it is possible for the user to arbitrarily provide the sequence of (in the case of Cartesian sampling) the line-by-line sampling in the phase coding direction and therewith the distribution of the measured k-space lines on different partial k-space data sets, the measurement of partial k-space data sets in order to then, in a further step, be able to effect a PPA reconstruction of each incomplete partial data set without the time-consuming acquisition of calibration scan lines. Acquisition of two k-space partial data sets 30, 31 ensues in FIG. 6, whereby the first partial data set 30 is characterized by only every odd-numbered line of the selected k-space slice (line 1, line 3, line 5 etc.) being acquired in temporal succession, and for the second partial data set 31 only every even-numbered line (line 2, line 4, line 6, etc.) is acquired in temporal succession. Combined, first partial data set 30 and the second partial data set 31 forms a complete k-space data set 32. By the division of the measurement into non-overlapping partial data sets, each partial data set separately represents a PPA data set that can be respectively reconstructed into a complete k-space data set using known PPA reconstruction methods (SMASH, SENSE, GRAPPA). The temporal series of the sampling of data set 32 is inventively selected such that each partial data set contains the least possible movement artifacts, such that after the respective PPA reconstruction both reconstructed data sets can be combined into one image, which ultimately contains minimal movement artifacts, without losing SNR. The inventive division into non-overlapping partial data sets enables a calculation of the coil sensitivities necessary for the PPA reconstruction without having to acquire a separate calibration scan, which ultimately leads to a significantly shorter acquisition time.

The inventive method is explained in more detail using an example from FIG. 7.

It is the goal to acquire an image (minimized with regard to movement artifacts) of a body slice of a patient to be examined in the overall shortest measurement time with maximum possible SNR. For this, the MRT apparatus is inventively configured such that the sampling of the slice in k-space leads to a complete k-space data set, which is composed of PPA-reconstructable partial data sets measured in temporal succession. The theoretical or computational division into partial data sets follows the actual measurement. In FIG. 7, a division of a Cartesian (sampled line-by-line), complete data set 32 into three partial data sets 34, 35, 36 is undertaken, that are respectively characterized by different k-space fine collections (groups). The temporal acquisition scheme is plotted on the right side of the complete data set 32.

The system computer 20 inventively controls the sequence controller 18 such that initially only the continuous lines 34.1, 34.2, 34.3 of the selected slice 32 is acquired. The time curve of this acquisition is plotted histogram-based on the right in the temporal acquisition scheme. The double arrow 34.x symbolizes the total duration that is required for this first partial measurement of this first (partial) data set. The dashed lines 35.1, 35.2, 35.3 are acquired immediately following this. This partial measurement in turn requires a time duration of 35.x. In this example, the last partial measurement of the dash-dot lines 36.1, 36.2, 36.3 completes the data set 32 and defines the temporal end point 36.3 of the total measurement duration (double arrow 34.1-36.3).

Any of these partial measurements leads to temporally contiguous partial data sets 34, 35, 36 that, due to their sampling schemes (linear k-space trajectory with two omitted k-space lines), each represent a separate PPA data set. The reduction of the acquisition time of each partial data set in comparison to the acquisition time of the complete data set 32 effects a similarly significant reduction of movement artifacts in the respective partial data set.

Due to the PPA-like sampling scheme of each partial data set, all partial data sets can be algebraically reconstructed into complete data sets and subsequently be transformed into complete MR images 38, 39, 40 Fourier transformation.

Possible reconstruction methods are based on conventional PPA techniques (for example SMASH, SENSE, GRAPPA). The information necessary for a PPA reconstruction, information about the sensitivities of the participating component coils, can likewise inventively ensue algebraically from the combination of the acquired partial data sets, whereby in general the consideration of adjacent lines 34.2, 35.2, 36.2 in the center region 42 of the complete data set 32 is sufficient for a good approximation of the sensitivities. The time-consuming measurement of calibration scan lines is not necessary. By a superimposition or combination of the spatial data sets 38, 39, 40 thus acquired into a single data set 41, an image is obtained which contains few image artifacts but which has a comparably high SNR, which was regained via the superimposition.

In summary, by a modified imaging sequence adapted to the circumstances of the anatomical movement, the total acquisition of a complete MRT image is fragmented into artifact-reduced partial acquisitions that are respectively reconstructed into whole images using PPA. The detector or coil sensitivity information that is necessary for a PPA reconstruction is obtained by a combination of the raw data of each individual partial image—preferably the middle region of the k-space data set. It is a condition for this that acquisition of the individual partial data sets inventively ensues such that the sum of the partial data sets do not overlap, but in total completely cover k-space. Each partial data set exhibits a reduced signal-to-noise ratio, which is, however, regained by recombination into a total whole image.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for magnetic resonance imaging comprising the steps of:
   using a magnetic resonance imaging scanner having a plurality of component RF coils, acquiring, with each of said coils, n partial k-space data sets in temporal succession by generating an i-th partial data set (i=1 through n) by a first-time acquisition of an i-th sub-unit of k-space and subsequent omission of n−1 sub-units of k-space, a totality of said n partial k-space data sets acquired by each coil forming a complete k-space data set for a sub-region, associated with that coil, of an examination region;
   for each component RF coil, determining a coil sensitivity based at least on a portion of said complete k-space data set;
   transforming each partial k-space data set using a PPA reconstruction technique and the respective coil sensitivities for said RF component coils, thereby obtaining a plurality of transformed partial k-space data sets;
   superimposing said plurality of transformed partial k-space data sets to obtain a low-artifact image data set of said examination region;
   making said low-artifact image data set available in a form allowing reconstruction of an image of said examination region therefrom.

2. A method as claimed in claim 1 comprising generating said n partial k-space data sets so that said totality of partial k-space data sets forms a complete two-dimensional k-space data set of said examination region.

3. A method as claimed in claim 1 comprising generating said n partial k-space data sets so that said totality of partial k-space data sets forms a complete three-dimensional k-space data set of said examination region.

4. A method as claimed in claim 1 comprising generating each of said n partial k-space data sets so that the transformed partial k-space data set corresponding thereto exhibits a minimum of at least one of movement artifacts, distortions and signal loss.

5. A method as claimed in claim 1 comprising employing a mid-range of said complete k-space data set for determining the respective coil sensitivities.

6. A method as claimed in claim 1 comprising transforming said n partial k-space data sets using a PPA reconstruction technique selected from the group consisting of SMASH, AUTO-SMASH, VD-AUTO-SMASH, SENSE and GRAPPA.

7. A method as claimed in claim 1 comprising generating said n partial k-space data sets by sampling sub-units of k-space.

8. A method as claimed in claim 1 comprising employing lines in k-space as said sub-units.

9. A method as claimed in claim 1 comprising employing spiral arms in k-space as said sub-units.

10. A method as claimed in claim 1 comprising employing radial sections in k-space as said sub-units.

11. A method as claimed in claim 1 comprising generating said n partial k-space data sets, transforming said n partial k-space data sets, and superimposing the transformed n partial k-space data sets in respectively different manners, and selecting a result for use as said low-artifact image data set having a least amount of artifacts.

12. A magnetic resonance apparatus comprising:
   an MRI scanner having an RF system comprising a plurality of component RF coils;
   a controller connected to said scanner that operates said scanner to acquire, for each of said coils, n partial k-space data sets in temporal succession by generating an i-th partial data set (i=1 through n) by a first-time acquisition of an i-th sub-unit of k-space and subsequent omission of n−1 sub-units of k-space, a totality of said n partial k-space data sets acquired by each coil forming a complete k-space data set for a sub-region, associated with that coil, of an examination region; and
   an image computer supplied with said n partial k-space data sets that determines, for each of said RF component coils, a coil sensitivity based at least on a portion of said complete k-space data set, and that transforms said n partial k-space data sets using a PPA reconstruction technique and the respective coil sensitivities to obtain n transformed partial k-space data sets, and that superimposes said n transformed partial k-space data sets to obtain a low-artifact image data set.

* * * * *